(12) United States Patent
Arivazhagan et al.

(10) Patent No.: US 10,908,970 B1
(45) Date of Patent: Feb. 2, 2021

(54) DATA INTERFACE FOR SECURE ANALYTIC DATA SYSTEM INTEGRATION

(71) Applicant: salesforce.com, inc., San Francisco, CA (US)

(72) Inventors: Ravishankar Arivazhagan, Belmont, CA (US); Nicholas Albert Bugajski, Mountain View, CA (US); Jesus De Oliveira, London (GB); Donovan A. Schneider, San Francisco, CA (US)

(73) Assignee: salesforce.com, inc., San Francisco, CA (US)

( * ) Notice: Subject to any disclaimer, the term of this patent is extended or adjusted under 35 U.S.C. 154(b) by 0 days.

(21) Appl. No.: 16/779,087

(22) Filed: Jan. 31, 2020

Related U.S. Application Data

(60) Provisional application No. 62/937,225, filed on Nov. 18, 2019.

(51) Int. Cl.
*G06F 9/54* (2006.01)
*H04L 12/46* (2006.01)
*G06F 9/455* (2018.01)
*G11C 7/10* (2006.01)
*G06F 3/0486* (2013.01)

(52) U.S. Cl.
CPC .............. *G06F 9/54* (2013.01); *G06F 3/0486* (2013.01); *G06F 9/45533* (2013.01); *G11C 7/1051* (2013.01); *H04L 12/4633* (2013.01)

(58) Field of Classification Search
None
See application file for complete search history.

(56) References Cited

U.S. PATENT DOCUMENTS

| | | | | |
|---|---|---|---|---|
| 2010/0241698 | A1* | 9/2010 | Hillerbrand | G06F 16/13 709/203 |
| 2014/0279201 | A1* | 9/2014 | Iyoob et al. | G06F 9/5077 705/26.7 |
| 2020/0310888 | A1* | 10/2020 | Gopalan | G06F 8/34 |

* cited by examiner

*Primary Examiner* — Craig C Dorais
(74) *Attorney, Agent, or Firm* — Holland & Hart LLP

(57) ABSTRACT

A method for data processing is described. The method may include configuring a connection template that defines a data extraction flow for a first data source and transmitting from an analytics application server a controller application programming interface (API) call based on a query request for data stored at the first data source. The method may further include instantiating a connector microservice based on the controller API call and the connection template, where the connector microservice is configured with a first data connector with the analytics application server and a second data connector with the first data source that is specific to the first data source. The method may further include retrieving at the analytics application server the data from the first data source based on the connector microservice.

20 Claims, 14 Drawing Sheets

US 10,908,970 B1

DATA INTERFACE FOR SECURE ANALYTIC DATA SYSTEM INTEGRATION

CROSS REFERENCES

The present Application for Patent claims priority to U.S. Provisional Patent Application No. 62/937,225 by Arivazhagan et al., entitled "DATA INTERFACE FOR SECURE ANALYTIC DATA SYSTEM INTEGRATION," filed Nov. 18, 2019, assigned to the assignee hereof.

FIELD OF TECHNOLOGY

The present disclosure relates generally to database systems and data processing, and more specifically to data interface for secure analytic data system integration.

BACKGROUND

A cloud platform (i.e., a computing platform for cloud computing) may be employed by many users to store, manage, and process data using a shared network of remote servers. Users may develop applications on the cloud platform to handle the storage, management, and processing of data. In some cases, the cloud platform may utilize a multi-tenant database system. Users may access the cloud platform using various user devices (e.g., desktop computers, laptops, smartphones, tablets, or other computing systems, etc.).

In one example, the cloud platform may support customer relationship management (CRM) solutions. This may include support for sales, service, marketing, community, analytics, applications, and the Internet of Things. A user may utilize the cloud platform to help manage contacts of the user. For example, managing contacts of the user may include analyzing data, storing and preparing communications, and tracking opportunities and sales.

The cloud platform may support an analytics application for analyzing data, making predictions, and generating insights. The analytics application may run on application servers that are internal to an organization (e.g., a multi-tenant database system). To retrieve data from data sources that are external to the organization, a data connector may be configured between the external data source and the internal analytics application. Configuring such data connectors may introduce security concerns for the organization in addition to adding implementation and configuration complexity.

DETAILED DESCRIPTION

Figure 1:
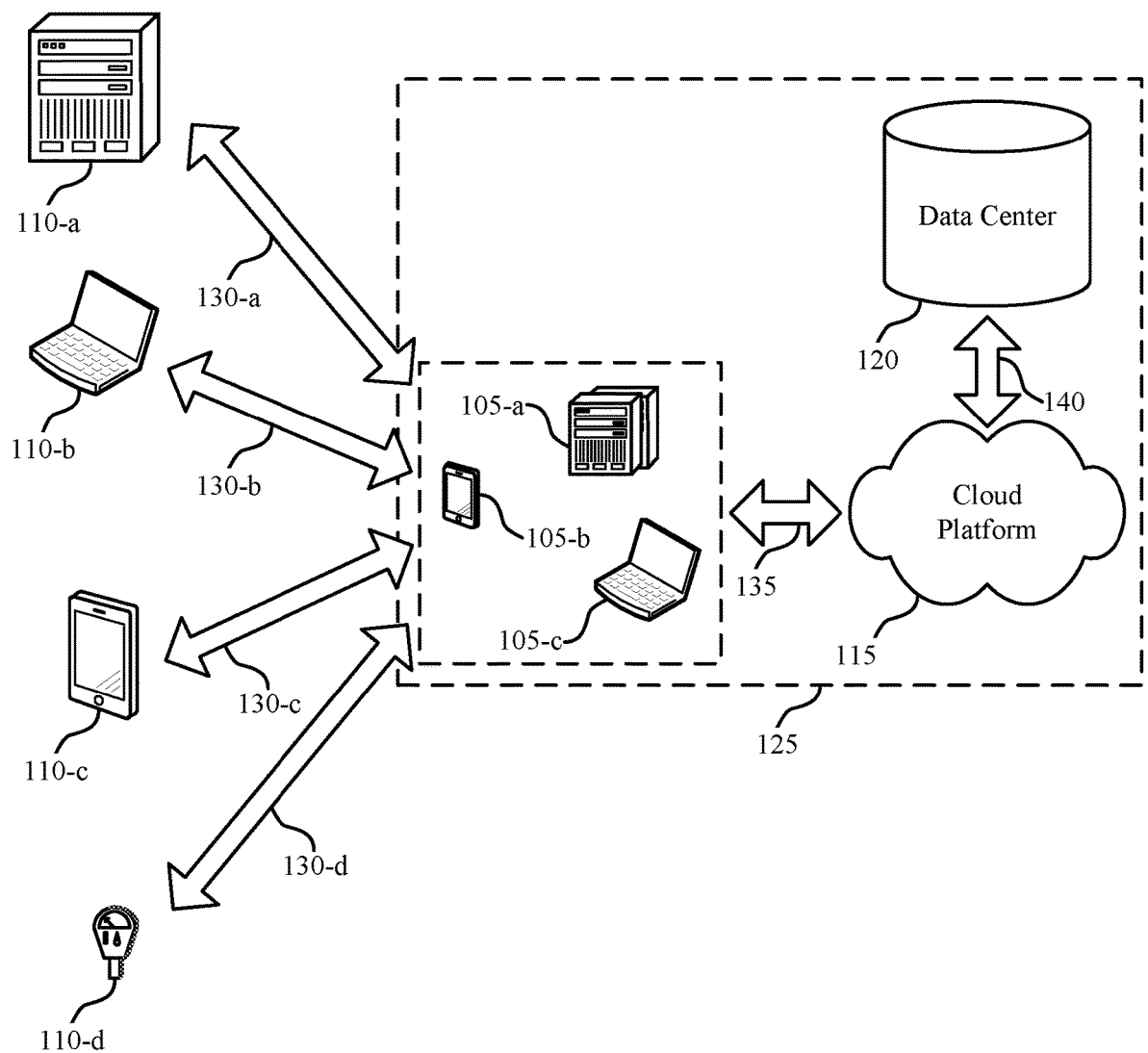
FIG. 1 illustrates an example of a system for data processing that supports data interface for secure analytic data system integration in accordance with aspects of the present disclosure.

In order to provide rich data analysis, more relevant insights and more accurate recommendations, a data analytics platform may require data sets from a customer system. An analytics platform may support two mechanisms to import data for this purpose. Existing systems may support two ways of importing data. First, a data sync capability may be supported, which retrieves data from selected cloud-hosted systems directly (e.g., a data pull model). Second, a file upload process or application programming interfaces (APIs) may be used to push data in, for any other custom application or on-premises data sources (e.g., a data push model). The data push model may be valuable for customers as it enables an analytics platform to reach customer's high-value data that lives in custom or legacy systems or on various on-premise or software as a service (SaaS) applications. However, such methods may introduce technical challenges for a customer, by for example requiring extraction, file preparation and upload of the data. A custom data connector and batch processing capabilities can be used to simplify some of these tasks, but it still may require technical skills from the customer to build, operate and maintain them.

The data pull model may provide fewer technical challenges for a customer. However, such an approach may introduce additional drawbacks. For example, this approach may not enable connectivity to on-premises systems, due to customer's inbound connectivity restrictions (firewalls and network security); and secondly, time-to-value for new connection types (i.e., connectors for new cloud systems) may not be optimal because of due diligence such as security reviews, as these connectivity components may be subject to in-depth security analysis because they run on internal servers that support multi-tenant operations.

Another technical challenge with existing external connector configurations is ensuring that the security of the client code that will be running in an internal data center, as well as the protocols that the code implements, meet the security standards of the operator the data center. In some cases, the data center may be a multi-tenant data center supporting on-demand cloud platform applications, and the data center may have strict security requirements imposed by one or more of the tenants. Therefore, configuring a connection that communicates directly between an internal analytics application server and an external data source may introduce security concerns. However, the ability to expand the connectivity options offered by an analytics platform to a much wider variety of source systems, while minimizing the security risks and technical and implantation challenges discussed above is needed.

Techniques described herein may enable a customer to use simplified extraction methods (e.g., a point-and-click interface of the pull model) and use the flexibility of the push model to enable any cloud or on-premise data source, but taking care of its complexity behind the scenes.

In accordance with aspects of the present disclosure, a controller API may be configured that adheres to an external data source contract. The controller API may support simplified connection configuration and setup (e.g., a point and click user interface (UI)), which illustrates lists of available connection types, provides required configuration parameters, data preview, and field selection.

A connection agent (e.g., a microservice) may be supported, which may be instantiated automatically by an analytics platform through the controller API. A connection agent may be created from a pre-defined connection template that defines the data extraction flow for each data source or system. Instance-specific parameters (e.g., hostname, user credentials, etc.) may be supplied by a customer through the analytics platform point-and-click user interface.

A connection agent may be deployed behind the scenes to a customer's on-premise data source or a customer's cloud-based data source. A connection agent may be stateless and immutable. A connection agent may leverage existing data connectors (e.g., connectors associated with an integration platform or connection service) to extract data from customer systems and provide the data directly to an analytics platform or upload the data through an existing data connector. A data extraction or upload execution may be triggered through an API call from the analytics platform directly to the connection agent instance through a tunneling service. Such a tunneling service may bypass customer firewalls and ensure strong authentication and data encryption. Data may be provided synchronously on the API call for datasets below a threshold, or uploaded to the analytics platform using an existing analytics-specific data connector for larger datasets. Such techniques may reduce the deployment cost per connector (e.g., by saving time and resources on security, source-based testing, integration, and performance). Such techniques may also provide for more efficient computational resource allocation by having separate connection agent instances per connector per customer (rather than using a shared connector server for several data sources).

Aspects of the disclosure are initially described in the context of an environment supporting an on-demand database service. Aspects of the disclosure are further described with respect to an illustration of a database system that supports data interface for secure analytic data system integration, and a series of exemplary process flow diagrams. Aspects of the disclosure are further illustrated by and described with reference to apparatus diagrams, system diagrams, and flowcharts that relate to data interface for secure analytic data system integration.

FIG. 1 illustrates an example of a system 100 for cloud computing that supports data interface for secure analytic data system integration in accordance with various aspects of the present disclosure. The system 100 includes cloud clients 105, contacts 110, cloud platform 115, and data center 120. Cloud platform 115 may be an example of a public or private cloud network. A cloud client 105 may access cloud platform 115 over network connection 135. The network may implement transfer control protocol and internet protocol (TCP/IP), such as the Internet, or may implement other network protocols. A cloud client 105 may be an example of a user device, such as a server (e.g., cloud client 105-*a*), a smartphone (e.g., cloud client 105-*b*), or a laptop (e.g., cloud client 105-*c*). In other examples, a cloud client 105 may be a desktop computer, a tablet, a sensor, or another computing device or system capable of generating, analyzing, transmitting, or receiving communications. In some examples, a cloud client 105 may be operated by a user that is part of a business, an enterprise, a non-profit, a startup, or any other organization type.

A cloud client 105 may interact with multiple contacts 110. The interactions 130 may include communications, opportunities, purchases, sales, or any other interaction between a cloud client 105 and a contact 110. Data may be associated with the interactions 130. A cloud client 105 may access cloud platform 115 to store, manage, and process the data associated with the interactions 130. In some cases, the cloud client 105 may have an associated security or permission level. A cloud client 105 may have access to certain applications, data, and database information within cloud platform 115 based on the associated security or permission level, and may not have access to others.

Contacts 110 may interact with the cloud client 105 in person or via phone, email, web, text messages, mail, or any other appropriate form of interaction (e.g., interactions 130-*a*, 130-*b*, 130-*c*, and 130-*d*). The interaction 130 may be a business-to-business (B2B) interaction or a business-to-consumer (B2C) interaction. A contact 110 may also be referred to as a customer, a potential customer, a lead, a client, or some other suitable terminology. In some cases, the contact 110 may be an example of a user device, such as a server (e.g., contact 110-*a*), a laptop (e.g., contact 110-*b*), a smartphone (e.g., contact 110-*c*), or a sensor (e.g., contact 110-*d*). In other cases, the contact 110 may be another computing system. In some cases, the contact 110 may be operated by a user or group of users. The user or group of users may be associated with a business, a manufacturer, or any other appropriate organization.

Cloud platform 115 may offer an on-demand database service to the cloud client 105. In some cases, cloud platform 115 may be an example of a multi-tenant database system. In this case, cloud platform 115 may serve multiple cloud clients 105 with a single instance of software. However, other types of systems may be implemented, including—but not limited to—client-server systems, mobile device systems, and mobile network systems. In some cases, cloud platform 115 may support CRM solutions. This may include support for sales, service, marketing, community, analytics, applications, and the Internet of Things. Cloud platform 115 may receive data associated with contact interactions 130 from the cloud client 105 over network connection 135, and may store and analyze the data. In some cases, cloud platform 115 may receive data directly from an interaction 130 between a contact 110 and the cloud client 105. In some cases, the cloud client 105 may develop applications to run on cloud platform 115. Cloud platform 115 may be implemented using remote servers. In some cases, the remote servers may be located at one or more data centers 120.

Data center 120 may include multiple servers. The multiple servers may be used for data storage, management, and processing. Data center 120 may receive data from cloud platform 115 via connection 140, or directly from the cloud client 105 or an interaction 130 between a contact 110 and the cloud client 105. Data center 120 may utilize multiple redundancies for security purposes. In some cases, the data stored at data center 120 may be backed up by copies of the data at a different data center (not pictured).

Subsystem 125 may include cloud clients 105, cloud platform 115, and data center 120. In some cases, data processing may occur at any of the components of subsystem 125, or at a combination of these components. In some cases, servers may perform the data processing. The servers may be a cloud client 105 or located at data center 120.

The cloud platform 115 may support an analytics application (e.g., one or more analytics application servers) for analyzing data, making predictions, and generating insights. The analytics application may run in the data center 120. The analytics application may pull data from internal data sources (e.g., internal to the organization that is running the data center 120), and may also pull data from external data sources (e.g., data sources that are outside of the organization such as those owned and operated by customers or contacts 110). To establish a connector with an external data source, the cloud platform 115 and/or the data center 120 may support a controller API that facilitates the creation of connection configuration. The controller API may be used to instantiate a connection agent, which may be instances of a pre-defined connection template that defines the data extraction flow for each external data source. The connection agents may run in an environment that is hosted by and/or operated by a customer (e.g., not running on data center 120). As such, the cloud platform 115 may communicate with the connection agent using a secure credential, and the connection agent may establish its own data connector with the external data source. In this way, the code running to configure and operate the data extraction may be run outside of the data center 120, which may alleviate security risks associated with establishing such external data connectors.

It should be appreciated by a person skilled in the art that one or more aspects of the disclosure may be implemented in a system 100 to additionally or alternatively solve other problems than those described above. Furthermore, aspects of the disclosure may provide technical improvements to "conventional" systems or processes as described herein. However, the description and appended drawings only include example technical improvements resulting from implementing aspects of the disclosure, and accordingly do not represent all of the technical improvements provided within the scope of the claims.

Figure 2:
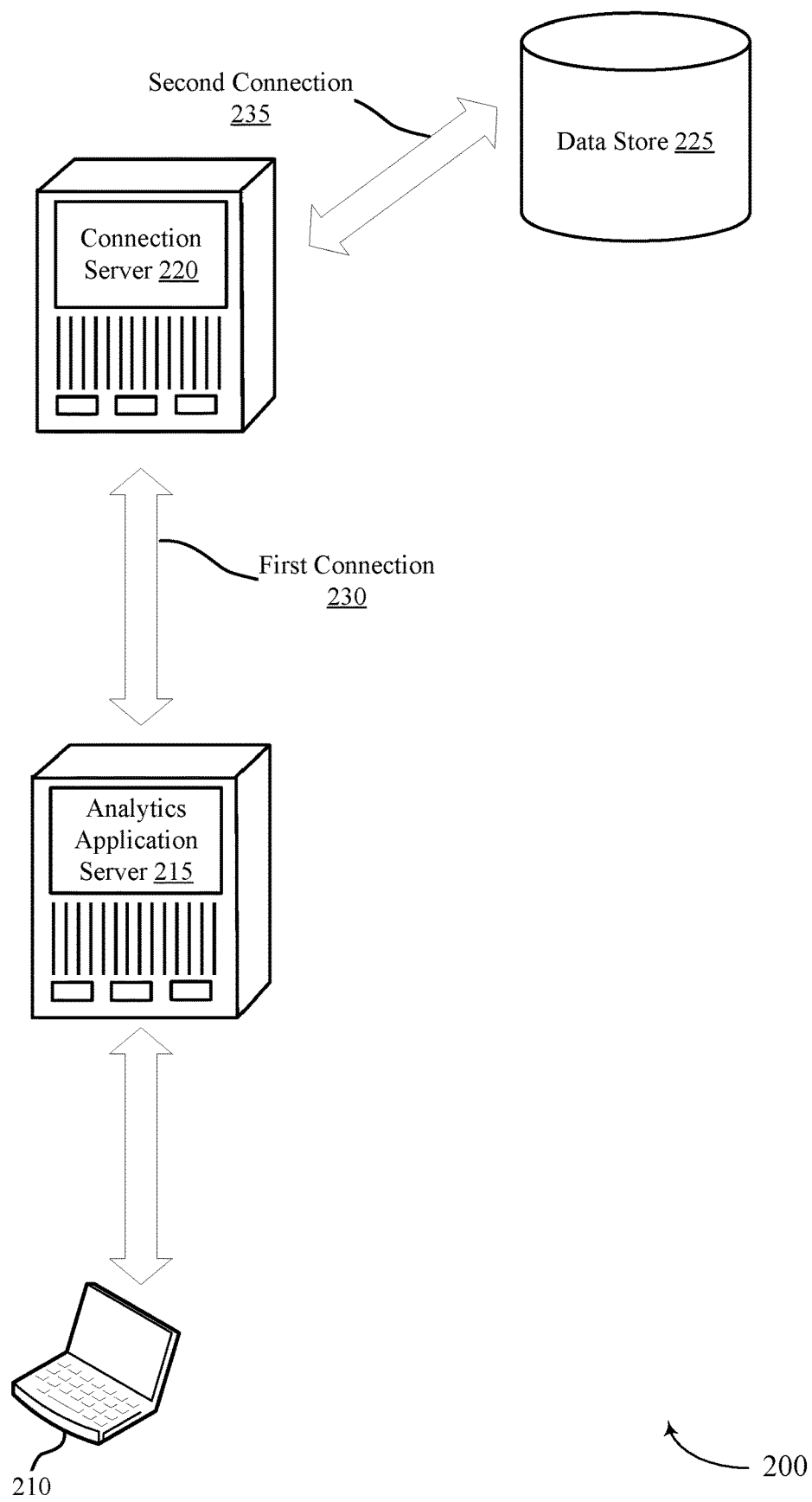
FIG. 2 illustrates an example of a system that supports data interface for secure analytic data system integration in accordance with aspects of the present disclosure.

FIG. 2 illustrates an example of a system 200 that supports data interface for secure analytic data system integration in accordance with aspects of the present disclosure. The system 200, which may be an example of a system for data processing, includes a user device 210, and analytics application server 215, a connection server 220, and a data store 225. The system 200 may implement aspects of the system 100 as described with reference to FIG. 1. For example, an analytics application server 215 and a connection server 220 may be examples or components of a cloud client 105-a (e.g., a server). A data store 225 may implement aspects of one or more of data center 120 or cloud platform 115 as described with reference to FIG. 1.

The analytics application server 215 may be an example of an analytics platform for analyzing and visualizing data and may leverage machine learning techniques. The connection server 220 may facilitate a connection with the data store 225 so that the analytics application server 215 may retrieve, visualize, and/or analyze data from the data store 225. For example, the connection server 220 may support a fully-automated and packaged framework that unlucks customer data sources for the analytics application server 215. The data store 225 may reside in a customer's data center or on a system for which there is not an existing connector available for the analytics application server 215.

A connection (e.g., a first connection 230) between the analytics application server 215 and the connection server 220 may be based on a common credential. The connection may be configured at a customer (or organization) level, or at the level of the analytics application server 215 setup that can be controlled by an administrator with a service account. Once a connection is configured, the connection server 220 may provided the analytics application server 215 with credentials or keys. Subsequently, the application analytics server 215 may connect to the connection server 220 using a URL and the set of saved credentials. In some examples, the credentials for the data store 225 may be configured into a template (referred to as connection agent templates discussed in more detail below).

The connection server 220 and the analytics application server 215 may support a controller API. The controller AI may orchestrate the instantiation of a connection agent template with user-supplied configuration parameters when requested by the analytics application server 215. The controller API may also provide the analytics application server 215 with a list of available templates and their metadata so that they can be presented to the user in an analytics data import configuration user interface.

A controller API may interact with another service (e.g., a connection management service) to manage, deploy, get status, un-deploy connection agent instances on a customer's on-premise system and/or a customer's cloud-based environment. That is, a connection agent instance may be run in an environment that is owned and operated by the customer. A controller API may support a variety of operations such as returning a list of all available templates, returning the metadata of a specific template, requesting the deployment of a template instance (which may require template name and configuration parameters and returns and instance identifier and instance-specific credentials), return a list of managed instances and their status, and return the metadata and status of a specific instance, including metadata or data retrieval endpoints.

The connection server 220 and the analytics application server 215 may support a connection agent template. A connection agent template may be specific to each type of data source or system. For example, separate templates may be crated for HTTP based connections, RDMS/JDBC connections, staging connections, etc. Second connection 235 may be an example of a connection that is specific to a data source or system. These templates may define the workflow to retrieve or extract data from a specific system and either return the data it push it to another system (e.g., to the analytics application server 215). All connection agent templates may expose the same connection agent API contract to enable the analytics application server 215 to interact with any instance of any type using the same logic. Each template may use a corresponding data connector internally to interact with the data source or customer system. As such, the complexities of the source-specific data connector may be managed at the connection server 220.

A connection agent template may be instantiated into a connection agent instance (e.g., a microservice) by the controller API by injecting the required configuration parameters that specify the access configuration for the data source or system for which the instance will extract data. Templates may be created and managed by a team associated with the analytics application server 215 and may reside in an exchange platform. A connection agent API contract may support the following operations: returning a list of available objects on the target system, returning metadata of the specified object, returning the list and metadata of the fields or attributes of the specified object, triggers data extraction or upload process. The data can be returned synchronously or asynchronously depending on the data size.

The connection server 220 may support one or more connection agent instances. These instances may be created from cloning a connection agent template and injecting customer specific configuration parameters. These connection agent instances may fulfill the connection agent API contract, thereby allowing the analytics application server 215 to perform extraction jobs and request data retrieval when required. A connection agent instance may be comprised of one or more virtual machines sitting behind a load balancer. The connection server 220 may support data pass through and staging patterns for data retrieval. For staging patterns, a user may connect the staging system with the connection server 220. In some cases, since a connection agent instance may be configured specifically for data analytics on the analytics application server 215, the data format can be configured for bulk data transfer.

Connection agent instances may run in a runtime environment that is operated by a customer (e.g., rather than the same system and servers that run the analytics application server 215). A connection agent instance may be instantiated for each data source. For example, a connection agent instance may run in a customer's cloud-based environment and/or a customer's on-premise environment. The connection agent instances may be instantiated, deployed, and managed by the controller API. Connection agent instances may be immutable such that any malfunctioning or configuration change only requires redeployment. The controller API may query for templates that are tagged as templates for analytics applications. The properties given to the user to fill in are the variables that are found in the template. Once the customer has provided the configuration parameters, the template may be used to generate an application package which is then deployed to the customer's cloud-based or on-premise system.

In an example, a connection agent instance running in a customer's cloud environment will connect directly to the analytics application server 215 using client credentials generated at deployment time (e.g., a client ID and secret) and encryption protocols (e.g., mTLS). In another example, a connection agent instance running in a customer's on-premise system may leverage a tunneling service supported by the connection server 220 to establish an on-demand, two-way secure tunnel to a cloud tunneling agent supported by the connection server 220. In such examples, the analytics application server 215 connects to the connection agent instance endpoint in the cloud through client credentials and mTLS as well, where the tunneling agent in the cloud routes traffic down to the connection agent instance behind the customer's firewall.

The tunneling service supported by the connection server 220 may enable a connection agent instance to run behind the customer's firewall and be reachable in a highly secure way by the analytics application server 215, without requiring the customer to open ports or configure network routes. The tunneling service may provision cloud-hosted tunneling agents, reachable by the analytics application server 215 through mTLS authentication. A connection agent instance opens an outbound network connection to these tunneling instances on start-up time, and a two-way network tunnel is established through this connection. The analytics application server 215 traffic to the tunneling agent in the cloud is routed through this tunnel to reach the specific connection agent instance behind the customer firewall.

Figure 3:
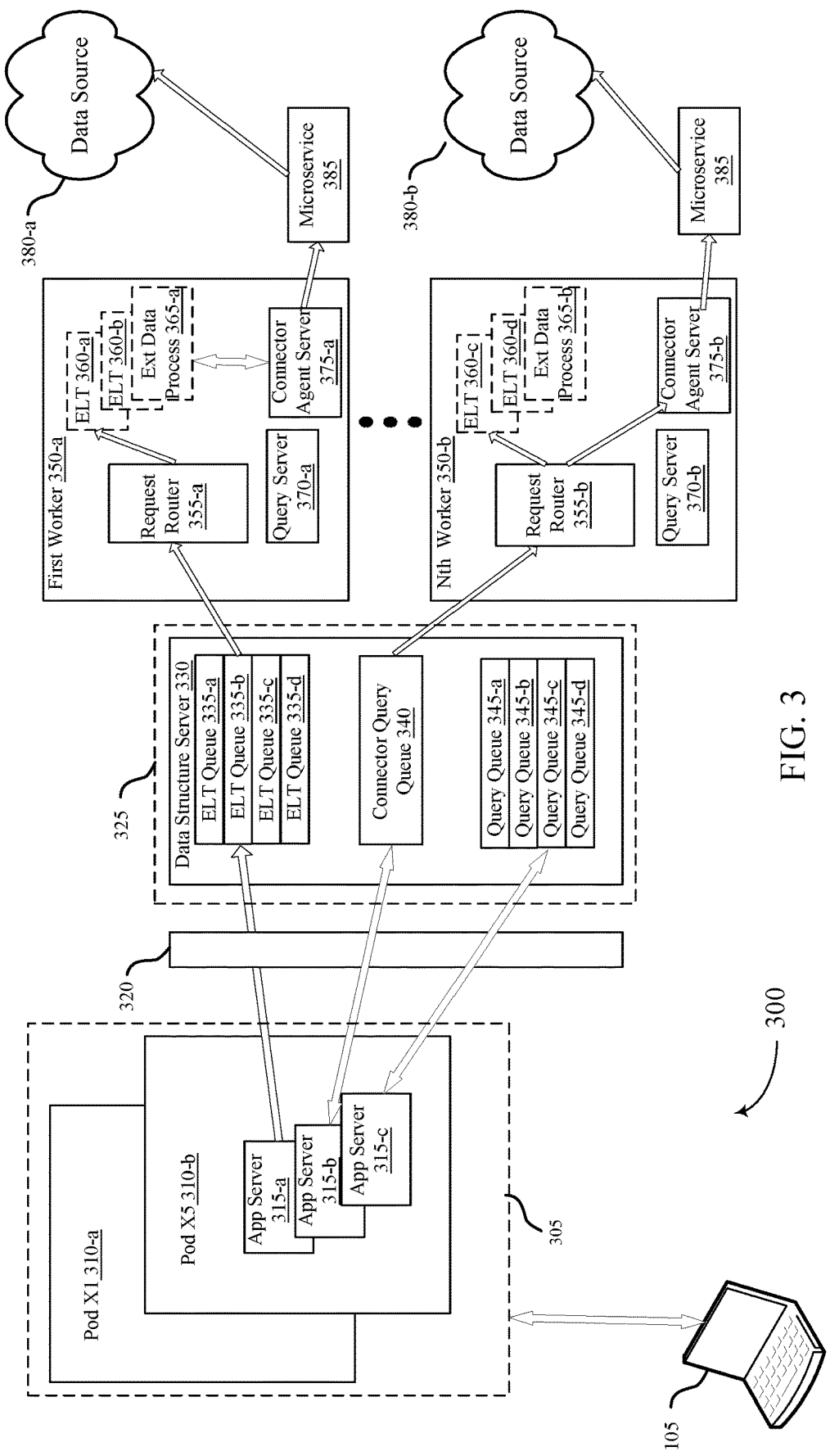
FIG. 3 illustrates an example of a first database system that supports data interface for secure analytic data system integration in accordance with aspects of the present disclosure.

FIG. 3 illustrates an example of a first database system 300 that supports data interface for secure analytic data system integration in accordance with aspects of the present disclosure. The system 300, which may be an example of a data analysis system, may include pods, or clusters, 305 including a plurality of pods 310 including a plurality of application servers 315, a validation and ID protection (VIP) service 320, a superpod 325 including a data structure server 330 including a plurality of extract, load, and transform (ELT) queues 335, a connector query queue 340, and a plurality of query queue 345, a plurality of workers 350, a plurality of microservices 385, and a plurality of data sources 380. In some examples, the plurality of workers 350 may include request router 355, a plurality of ELTs 360, an external data process 365, a query server 370, and a connector agent server 375.

In some examples, the connector agent may be an example of a connector server or a remote query execution server. The system 300 may implement aspects of the system 100 as described with reference to FIG. 1 and may implement aspects of the generic query 200 as described with reference to FIG. 2. For example, a pod 305, a VIP 320, a superpod 325, and a data structure server 330, or a combination thereof may be examples or components of a data center 120. An application server 315, an ELT queue 335, a connector query queue 340, and a query queue 345, or a combination thereof may implement aspects of subsystem 125 and generic query 200 as described with references to FIG. 1 and FIG. 2. Additionally, in some examples, microservice 385 may implement aspects of subsystem 125, analytics application server 215, and connection server 220, or any combination thereof, as described above with references to FIG. 1 and FIG. 2.

In some cases, a user device 105, such as the user devices associated with the cloud client 105 shown in FIG. 1, may generate a query for the data that is disparate to the database system 300 which may be received by one of the application servers 315. In this case, the application server 315-*b* may receive the query and determine that the data requested by the received query is disparate to the database system 300 and stored within the cloud platform 380-*b*. Based on this determination, the application server 315-*a* may select connector query queue 340 corresponding to interaction with the cloud platform 380-*b* by the database system 300.

In some cases, the database system 300 identifies a first query language corresponding to the determined disparate data source. For example, the database system 300 may determine the first query language corresponding to the cloud platform 380-*b*. In some examples, the data structure server 330 may determine the first query language based on the corresponding data source.

In some cases, based on the determined first query language, the database system 300 may generate a converted query from the query received from the user. In some examples, as illustrated in FIG. 3, the converted query is transmitted via the connector query queue 340 to request router 355-*b* associated with an Nth worker 350-*b*. In some examples, the converted query is transmitted to both of an ELT 360 and a connector agent server 375-*b*.

In some cases, the converted query is transmitted from the connector agent server 375-*b* via the selected connector query queue 340 to the microservice 385. In some examples, as described further above in reference to FIG. 2, a connection agent instance running in a customer's cloud environment (e.g., data source 380-*b*) may connect directly to the microservice 385 or the system my leverage a tunneling service supported by the microservice 385 to establish an on-demand, two-way secure tunnel to a cloud tunneling agent supported by the microservice 385. In some cases, once one of the above services has been established, the converted query is transmitted via the microservice 385 to the cloud platform 380-*b* that contains the queried data and the queried data is retrieved for visualization and analyzation by the user from the cloud platform 380-*b* based at least in part on the converted query.

Figure 4:
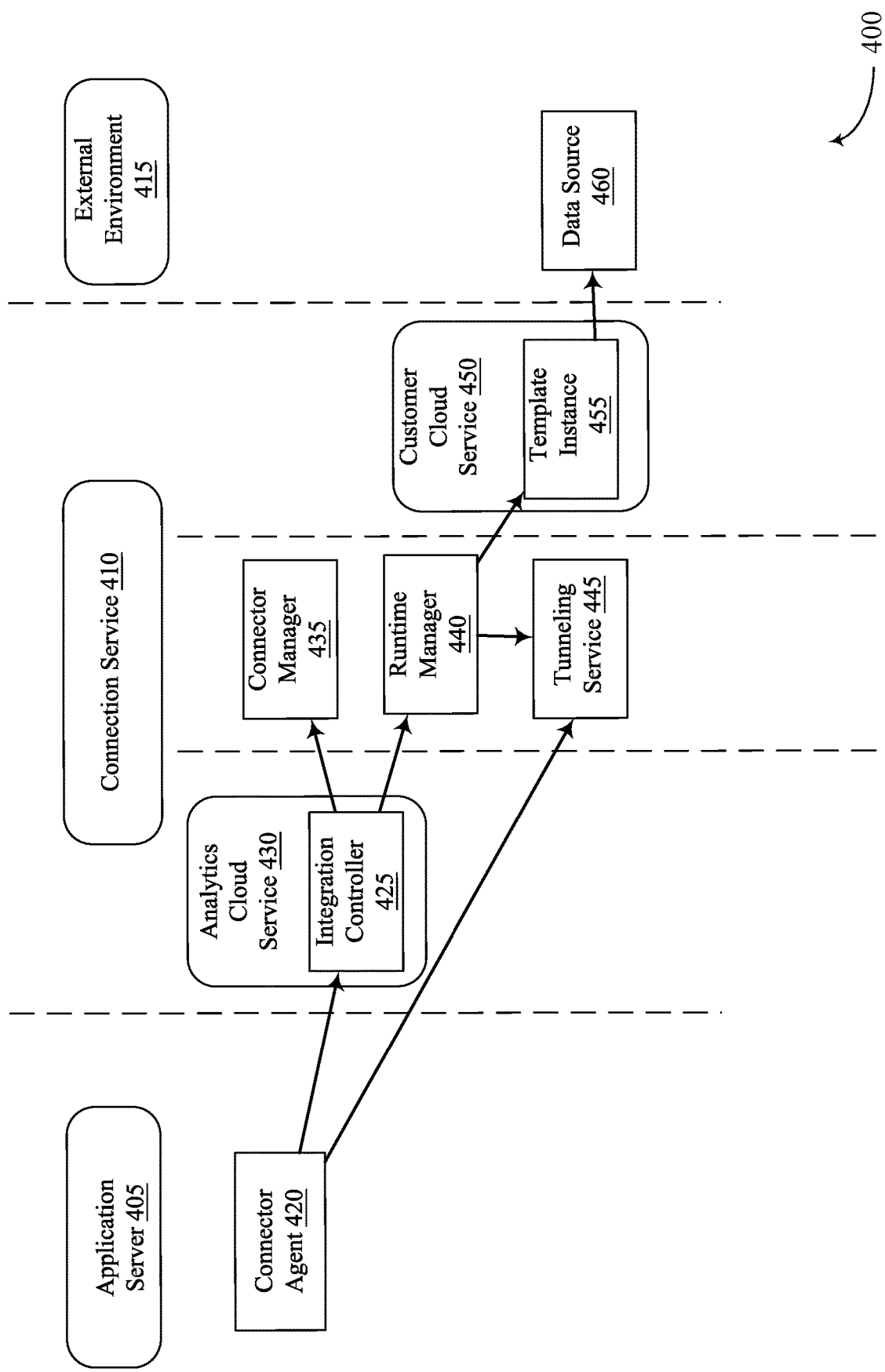
FIG. 4 illustrates an example of a second database system that supports data interface for secure analytic data system integration in accordance with aspects of the present disclosure.

FIG. 4 illustrates an example of a second database system 400 that supports data interface for secure analytic data system integration in accordance with aspects of the present disclosure. The system 400, which may be an example of a data analysis system, may include an application server 405, a connection service 410, and an external environment 415. The application server 405 may include a connector agent 420. The connection service 410 may include an analytics cloud service 430 including an integration controller 425, a connector manager 435, a runtime manager 440, a tunneling service 445, a customer cloud service 450, and a template instance 455. In some examples, the connection service 410 may include a standalone integration controller 425. Additionally, the external environment may include a data source 60.

In some cases, the system 400 may implement aspects of the systems 100, 200, or 300 and described above with reference to FIGS. 1-3. For example, the application server 405, and the corresponding connector agent 420, may be examples or components of the subsystem 125, the connection server 220, or the analytics application server 215. In some cases, the connection service 410, and the above-referenced associated components, may be examples or components of the subsystem 125, the connection server 220, the analytics application server 215, the pods 305, or the data structure server 330, for example, as described with reference to FIGS. 1-3.

In some cases, the connector agent 420 of the application server 405, in cooperation with the integration controller 425, may transmit requests to the integration controller 425 and the tunneling service 445. In some examples, the requests may be transmitted to the integration controller 425 and the tunneling service 445 simultaneously. In this case, in the integration controller 425, in cooperation with an analytics cloud service, may integrate the request and transmit the resulting communication to both of the connector manager 435 and the runtime manager 440. In some examples, the runtime manager 440 may then process the communication and transmit the transmission to the tunneling service 445 and to the template instance 455. In some cases, the customer cloud service 450 may cooperate with the template instance 455 to facilitate delivering the transmission to the data source 460. In some cases, the integration controller 425 may operate as a standalone integration controller 425 and may receive the transmissions from the connector agent as part of the connection service 410.

Figure 5:
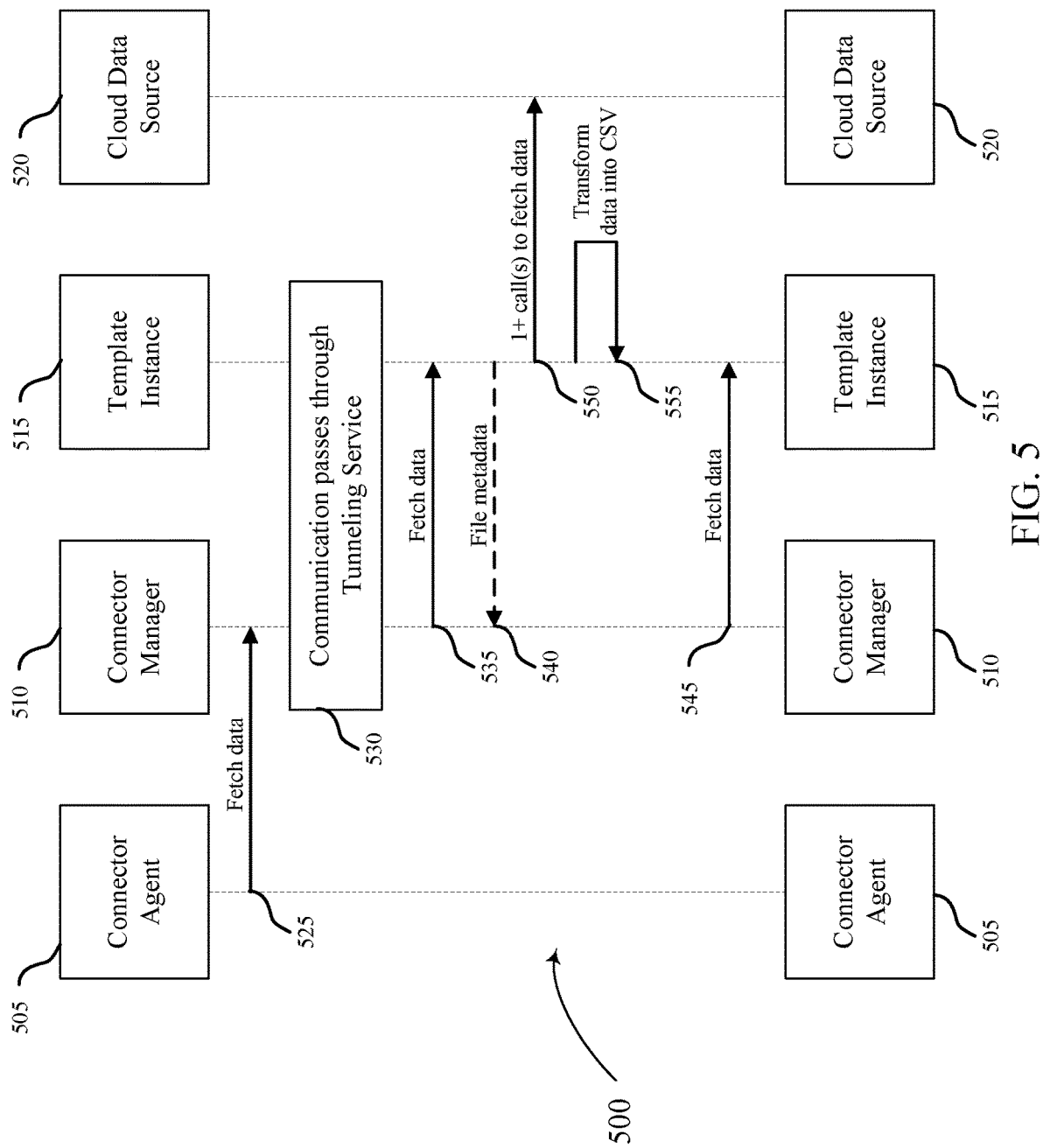
FIG. 5 illustrates an example of a first process flow diagram that supports data interface for secure analytic data system integration in accordance with aspects of the present disclosure.

FIG. 5 illustrates an example of a first process flow diagram 500 that supports data interface for secure analytic data system integration in accordance with aspects of the present disclosure. The process flow 500 may include a connector agent 505, a connector manager 510, a template instance 515, and a cloud data source 520. These may be examples of the corresponding devices described above with reference to FIGS. 1 through 4. Alternative examples of the following may be implemented, where some steps are performed in a different order than described or are not performed at all. In some cases, steps may include additional features not mentioned below, or further steps may be added.

At a first step 525, the connector manager 510 may request data from the connector agent 505. In some cases, the connector manager 510 may be an example of a specific connector, such as a mulesoft connector.

At a step 530, communications between the connector manager 510 and the template instance 515 may pass through a tunneling service. Using this tunneling service, at step 535, data is fetched from the connector manager 510 by the template instance 515.

At a step 540, while still passing communications through the tunneling service, metadata is transmitted from the template instance 515 to the connector manager 510. In some cases, the file metadata is transmitted from the template instance 515 to the connector manager 510 in response to step 535 by the template instance 515. In some cases, the file metadata is automatically transmitted to the connector manager 510 at the step 540. Additionally, in some cases, at a step 545, additional data is fetched by the template instance 515 from the connector manager 510.

At a step 550, one or more calls to fetch data from the template instance 515 by the cloud data source 520 are issued by the cloud data source 520. In some cases, the cloud data source 520 may issue calls to fetch data from the template instance 515 until the requested data has been transmitted to and received by the cloud data source 520. In some cases, the calls to fetch data from the template instance 515 may be issued by any other component illustrated within the flow diagram 500. Further, at step 555, data may be transformed into comma-separate-values (CSV) by the template instance 515.

Figure 6:
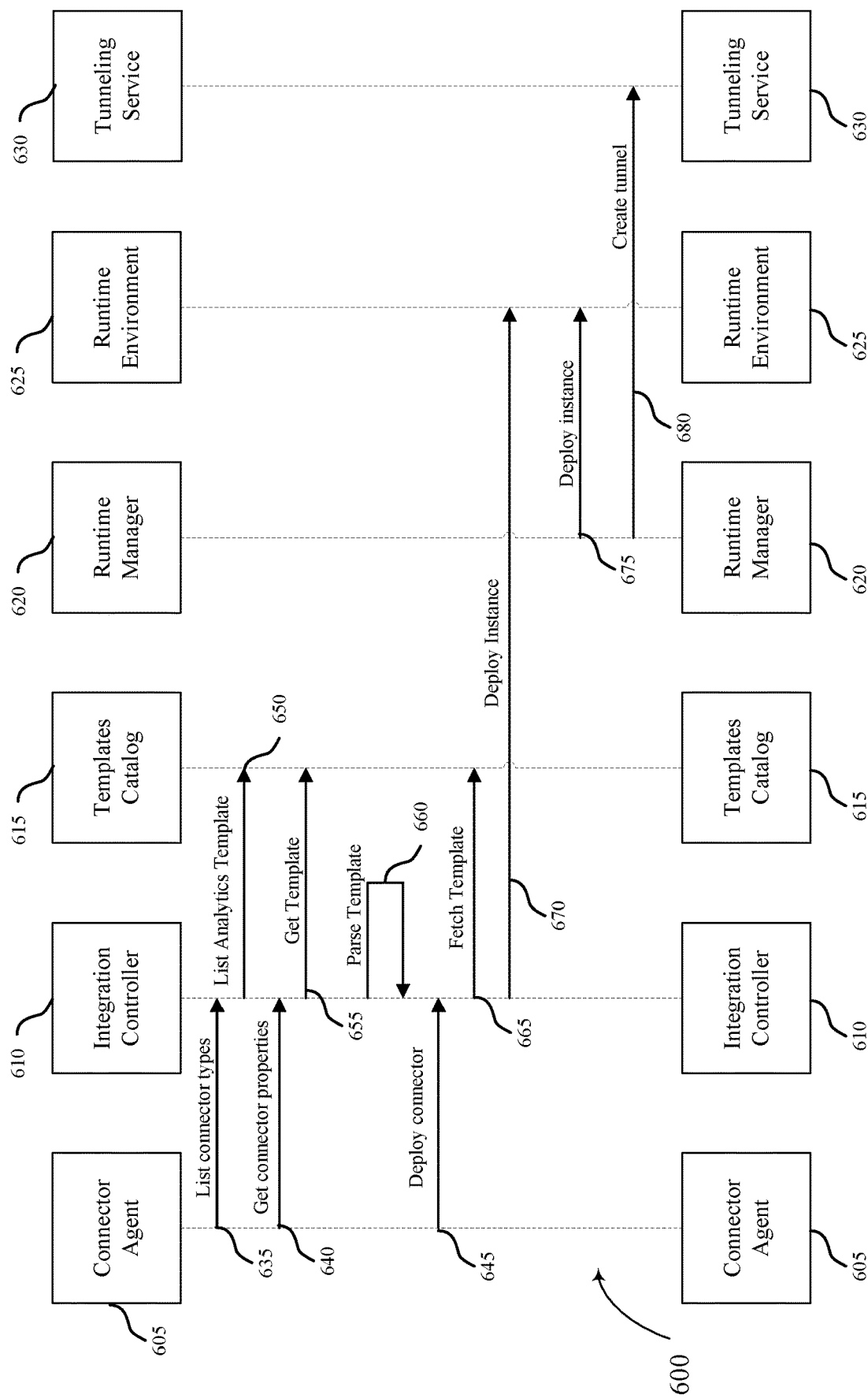
FIG. 6 illustrates an example of a second process flow diagram that supports data interface for secure analytic data system integration in accordance with aspects of the present disclosure.

FIG. 6 illustrates an example of a second process flow diagram 600 that supports data interface for secure analytic data system integration in accordance with aspects of the present disclosure. The process flow 600 may include a connector agent 605, an integration controller 610, a templates catalog 615, a runtime manager 620, a runtime environment 625, and a tunneling service 630. These may be examples of the corresponding devices described above with reference to FIGS. 1 through 5. For example, the tunneling service 630 may implement aspects of the system 100 as described with reference to FIG. 1 and may implement aspects of the system 200, including the tunneling service supported by the connection server 220, as described with reference to FIG. 2. Alternative examples of the following may be implemented, where some steps are performed in a different order than described or are not performed at all. In some cases, steps may include additional features not mentioned below, or further steps may be added.

At a first step 635, connector types are listed to the integration controller 610 by the connector agent 605. At a step 640, the integration controller 610 gets the connector properties from the connector agent 605. Further, at a step 645, the connector agent 605 deploys the connector(s) to the integration controller 610.

At a step 650, the integration controller 610 lists an analytics template for the templates catalog 615. Additionally, at a step 655, the templates catalog 615 receives the template(s) from the integration controller 610. At a step 660 the template to be received by the templates catalog 615 is parsed by the integration controller 610. At a step 665, the template is fetched from the integration controller 610 by the templates catalog 615. Additionally, at a step 670, an instance of the template is deployed by the integration controller 610 to the runtime environment 625.

At a step 675, an additional instance of the template is deployed by the runtime manager 620 to the runtime environment 625. Further, at a step 680, a tunnel is created, as described further above with respect to FIGS. 1-5, and extends between the runtime manager 620 and the tunneling service 620. In some cases, the tunneling service creates the tunnel between the runtime manager 620 and the tunneling service 630. In other cases, any additional steps that facilitate operation of the systems described herein may be performed.

Figure 7:
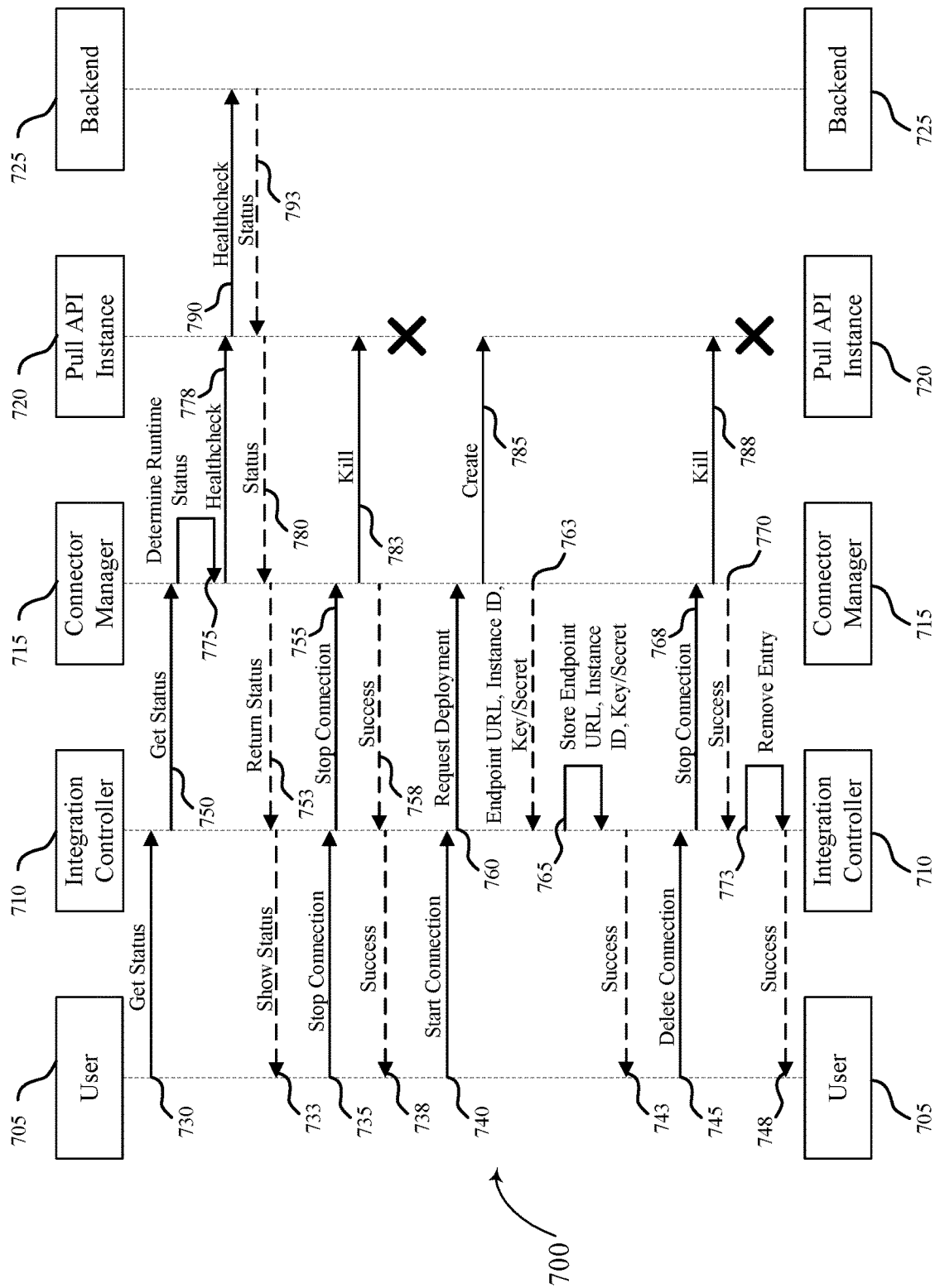
FIG. 7 illustrates an example of a third process flow diagram that supports data interface for secure analytic data system integration in accordance with aspects of the present disclosure.

FIG. 7 illustrates an example of a third process flow diagram 700 that supports data interface for secure analytic data system integration in accordance with aspects of the present disclosure. The process flow 700 may include a user 705, an integration controller 710, and a connector manager 715. These may be examples of the corresponding devices described above with reference to FIGS. 1 through 6. For example, the integration controller 710 and the connector manager 715 may implement aspects of the system 100 as described with reference to FIG. 1, may implement aspects of the system 200 as described with reference to FIG. 2, and may implement aspects of the system 300 as described with reference to FIG. 3. Alternative examples of the following may be implemented, where some steps are performed in a different order than described or are not performed at all. In some cases, steps may include additional features not mentioned below, or further steps may be added.

At a step 730 the user 705 may get a status from the integration controller 710. At a step 750, the integration controller 710 may get a status from the connector manager 715. At a step 775, the connector manager may determine a runtime status of the connector manager 715 and may then, at a step 778, perform a healthcheck on the pull API instance. At a step 790, the pull API instance 720 may perform a healthcheck on the backend 725.

At a step 793, the backend 725 may transmit its status to the pull API instance 720, which in turn, at a step 780, may transmit the status to the connector manager 715. At a step 753, the status may be returned to the integration controller 710, which may, at a step 733, show the status to the user 705. At a step 735, a connection may be stopped by the user 705 at the integration controller 710. At a step 755, the integration controller may stop a connection at the connector manager 715. At a step 783, the connector manager 715 may kill the pull API instance 720. At a step 758, the connector manager may signal to the integration controller 710 that the kill was successful, and at a step 738, the integration controller 710 may signal to the user 705 that the kill was successful.

At a step 740, the user 705 may start a connection with the integration controller 710. At a step 760, the integration controller 710 may request deployment of the connector manager 715. At a step 785, the connector manager may create another pull API instance 720. At a step 763, the connector manager 715 signals an endpoint URL, instance ID, and a key/secret to the integration controller 710. At a step 765, the integration controller 710 stores the endpoint URL, instance ID, and the key/secret. At a step 743, the integration controller 710 signals to the user 705 that the connection start was a success.

At a step 745, the user 705 deletes the previously created connection at the integration controller. At a step 768, the integration controller 710 stops the connection at the connector manager 715. At a step 788, the connector manager 715 kills the pull API instance 720. At a step 770, the connector manager 715 signals to the integration controller 710 that the kill has been successful. At a step 773, the integration controller 710 removes an entry. At a step 748, the integration controller 710 signals to the user 705 that the kill of the pull API instance 720 was successful.

Figure 8:
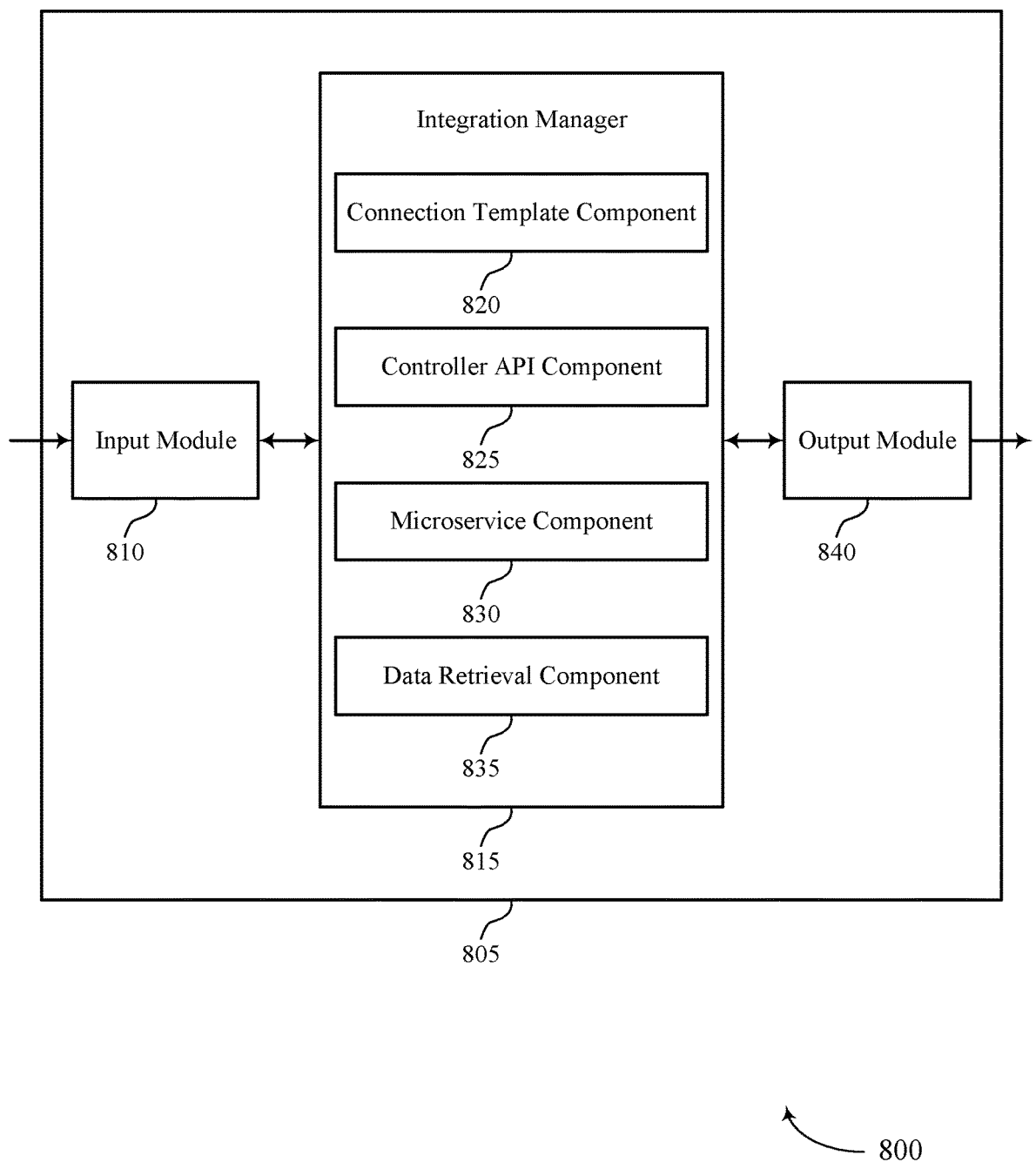
FIG. 8 shows a block diagram of an apparatus that supports data interface for secure analytic data system integration in accordance with aspects of the present disclosure.

FIG. 8 shows a block diagram 800 of an apparatus 805 that supports data interface for secure analytic data system integration in accordance with aspects of the present disclosure. The apparatus 805 may include an input module 810, an integration manager 815, and an output module 840. The apparatus 805 may also include a processor. Each of these components may be in communication with one another (e.g., via one or more buses). In some cases, the apparatus 805 may be an example of a user terminal, a database server, or a system containing multiple computing devices.

The input module 810 may manage input signals for the apparatus 805. For example, the input module 810 may identify input signals based on an interaction with a modem, a keyboard, a mouse, a touchscreen, or a similar device. These input signals may be associated with user input or processing at other components or devices. In some cases, the input module 810 may utilize an operating system such as iOS®, ANDROID®, MS-DOS®, MS-WINDOWS®, OS/2®, UNIX®, LINUX®, or another known operating system to handle input signals. The input module 810 may send aspects of these input signals to other components of the apparatus 805 for processing. For example, the input module 810 may transmit input signals to the data retention module 815 to support data retention handling for data object stores. In some cases, the input module 810 may be a component of an input/output (I/O) controller 1015 as described with reference to FIG. 10.

The integration manager 815 may include a connection template component 820, a controller access point (AP)I component 825, a microservice component 830, and a data retrieval component 835. The integration manager 815 may be an example of aspects of the integration manager 905 or 1010 described with reference to FIGS. 9 and 10.

The integration manager 815 and/or at least some of its various sub-components may be implemented in hardware, software executed by a processor, firmware, or any combination thereof. If implemented in software executed by a processor, the functions of the integration manager 815 and/or at least some of its various sub-components may be executed by a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described in the present disclosure. The integration manager 815 and/or at least some of its various sub-components may be physically located at various positions, including being distributed such that portions of functions are implemented at different physical locations by one or more physical devices. In some examples, the integration manager 815 and/or at least some of its various sub-components may be a separate and distinct component in accordance with various aspects of the present disclosure. In other examples, the integration manager 815 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

The connection template component 820 may configure a connection template that defines a data extraction flow for a first data source.

The controller API component 825 may transmit, from an analytics application server, a controller application programming interface (API) call based on a query request for data stored at the first data source.

The microservice component 830 may instantiate a connector microservice based on the controller API call and the connection template, where the connector microservice is configured with a first data connector with the analytics application server and a second data connector with the first data source that is specific to the first data source.

The data retrieval component 835 may retrieve, at the analytics application server, the data from the first data source based on the connector microservice.

The output module 840 may manage output signals for the apparatus 805. For example, the output module 840 may receive signals from other components of the apparatus 805, such as the data retention module 815, and may transmit these signals to other components or devices. In some specific examples, the output module 840 may transmit output signals for display in a user interface, for storage in a database or data store, for further processing at a server or server cluster, or for any other processes at any number of devices or systems. In some cases, the output module 840 may be a component of an I/O controller 1015 as described with reference to FIG. 10.

Figure 9:
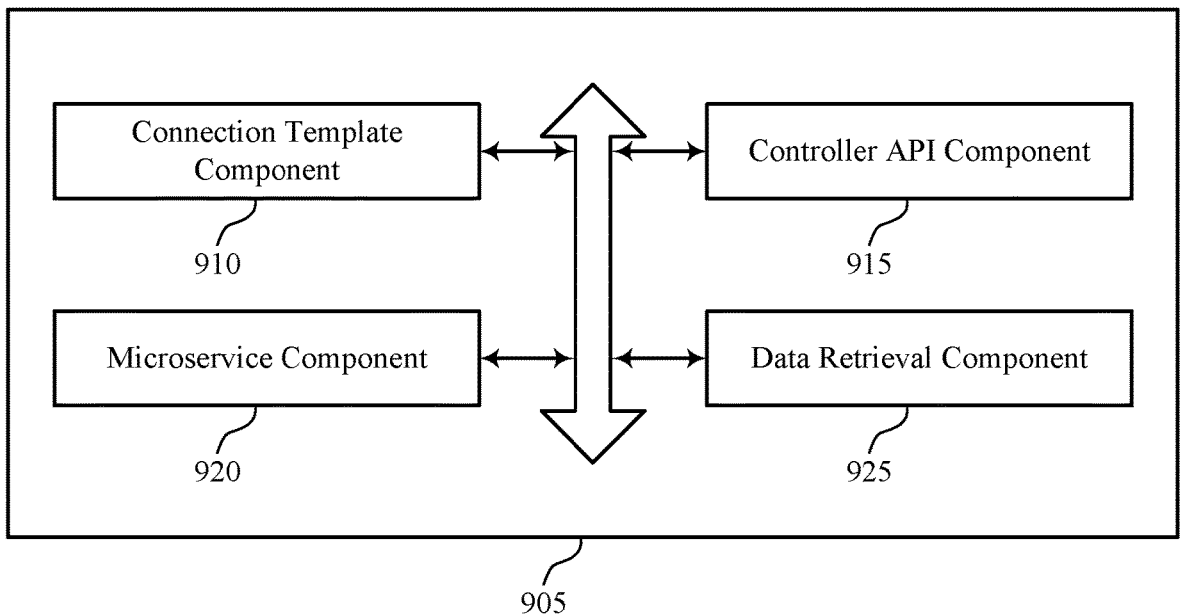
FIG. 9 shows a block diagram of a integration manager that supports data interface for secure analytic data system integration in accordance with aspects of the present disclosure.

FIG. 9 shows a block diagram 900 of a integration manager 905 that supports data interface for secure analytic data system integration in accordance with aspects of the present disclosure. The integration manager 905 may be an example of aspects of a integration manager 815 or a integration manager 1010 described herein. The integration manager 905 may include a connection template component 910, a controller API component 915, a microservice component 920, and a data retrieval component 925. Each of these modules may communicate, directly or indirectly, with one another (e.g., via one or more buses).

The connection template component 910 may configure a connection template that defines a data extraction flow for a first data source.

In some examples, the connection template component 910 may build the connection template using a drag and drop user interface.

The controller API component 915 may transmit, from an analytics application server, a controller application programming interface (API) call based on a query request for data stored at the first data source.

In some cases, the controller API call includes configuration parameters that specify an access configuration for the first data source.

The microservice component 920 may instantiate a connector microservice based on the controller API call and the connection template, where the connector microservice is configured with a first data connector with the analytics application server and a second data connector with the first data source that is specific to the first data source.

In some examples, the microservice component 920 may establish a direct connection between the analytics application server and the first data source, where the connector microservice is running in a user-controlled cloud-based environment.

In some examples, the microservice component 920 may establish a two-way secure tunnel between the analytics application server and the first data source, where the two-way secure tunnel bypasses a user firewall, and where the connector microservice is running in a user-controlled on-premise environment.

In some cases, the connector microservice includes one or more virtual machines.

The data retrieval component 925 may retrieve, at the analytics application server, the data from the first data source based on the connector microservice.

In some cases, the data is retrieved from the first data source via a pull-based technique.

Figure 10:
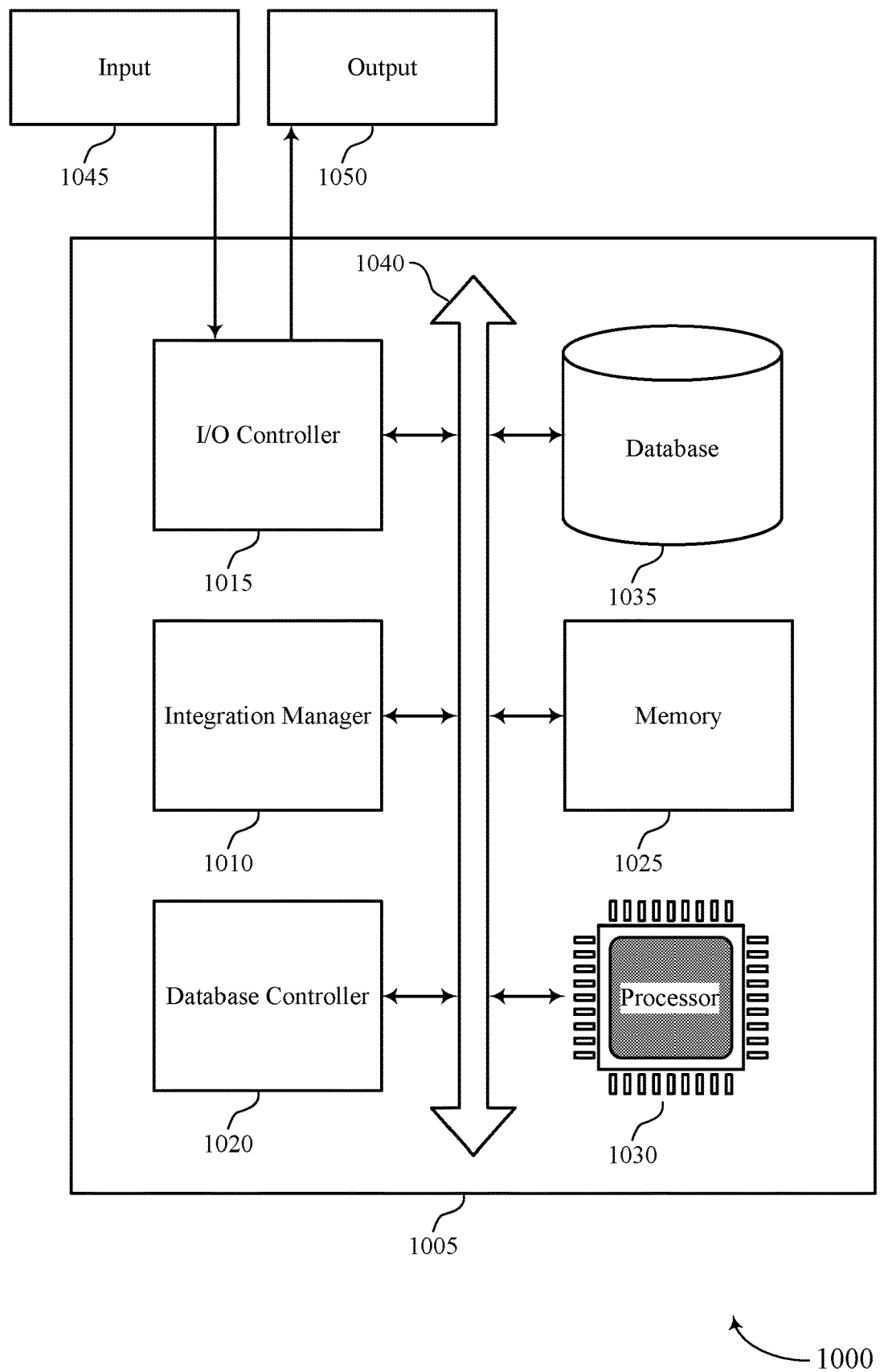
FIG. 10 shows a diagram of a system including a device that supports data interface for secure analytic data system integration in accordance with aspects of the present disclosure.

FIG. 10 shows a diagram of a system 1000 including a device 1005 that supports data interface for secure analytic data system integration in accordance with aspects of the present disclosure. The device 1005 may be an example of or include the components of a application server or an apparatus 805 as described herein. The device 1005 may include components for bi-directional data communications including components for transmitting and receiving communications, including an integration manager 1010, an I/O controller 1015, a database controller 1020, memory 1025, a processor 1030, and a database 1035. These components may be in electronic communication via one or more buses (e.g., bus 1040).

The integration manager 1010 may be an example of a integration manager 815 or 905 as described herein. For example, the integration manager 1010 may perform any of the methods or processes described above with reference to FIGS. 8 and 9. In some cases, the integration manager 1010 may be implemented in hardware, software executed by a processor, firmware, or any combination thereof.

The I/O controller 1015 may manage input signals 1045 and output signals 1050 for the device 1005. The I/O controller 1015 may also manage peripherals not integrated into the device 1005. In some cases, the I/O controller 1015 may represent a physical connection or port to an external peripheral. In some cases, the I/O controller 1015 may utilize an operating system such as iOS®, ANDROID®, MS-DOS®, MS-WINDOWS®, OS/2®, UNIX®, LINUX®, or another known operating system. In other cases, the I/O controller 1015 may represent or interact with a modem, a keyboard, a mouse, a touchscreen, or a similar device. In some cases, the I/O controller 1015 may be implemented as part of a processor. In some cases, a user may interact with the device 1005 via the I/O controller 1015 or via hardware components controlled by the I/O controller 1015.

The database controller 1020 may manage data storage and processing in a database 1035. In some cases, a user may interact with the database controller 1020. In other cases, the database controller 1020 may operate automatically without user interaction. The database 1035 may be an example of a single database, a distributed database, multiple distributed databases, a data store, a data lake, or an emergency backup database.

Memory 1025 may include random-access memory (RAM) and read-only memory (ROM). The memory 1025 may store computer-readable, computer-executable software including instructions that, when executed, cause the processor to perform various functions described herein. In some cases, the memory 1025 may contain, among other things, a basic input/output system (BIOS) which may control basic hardware or software operation such as the interaction with peripheral components or devices.

The processor 1030 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, the processor 1030 may be configured to operate a memory array using a memory controller. In other cases, a memory controller may be integrated into the processor 1030. The processor 1030 may be configured to execute computer-readable instructions stored in a memory 1025 to perform various functions (e.g., functions or tasks supporting data interface for secure analytic data system integration).

Figure 11:
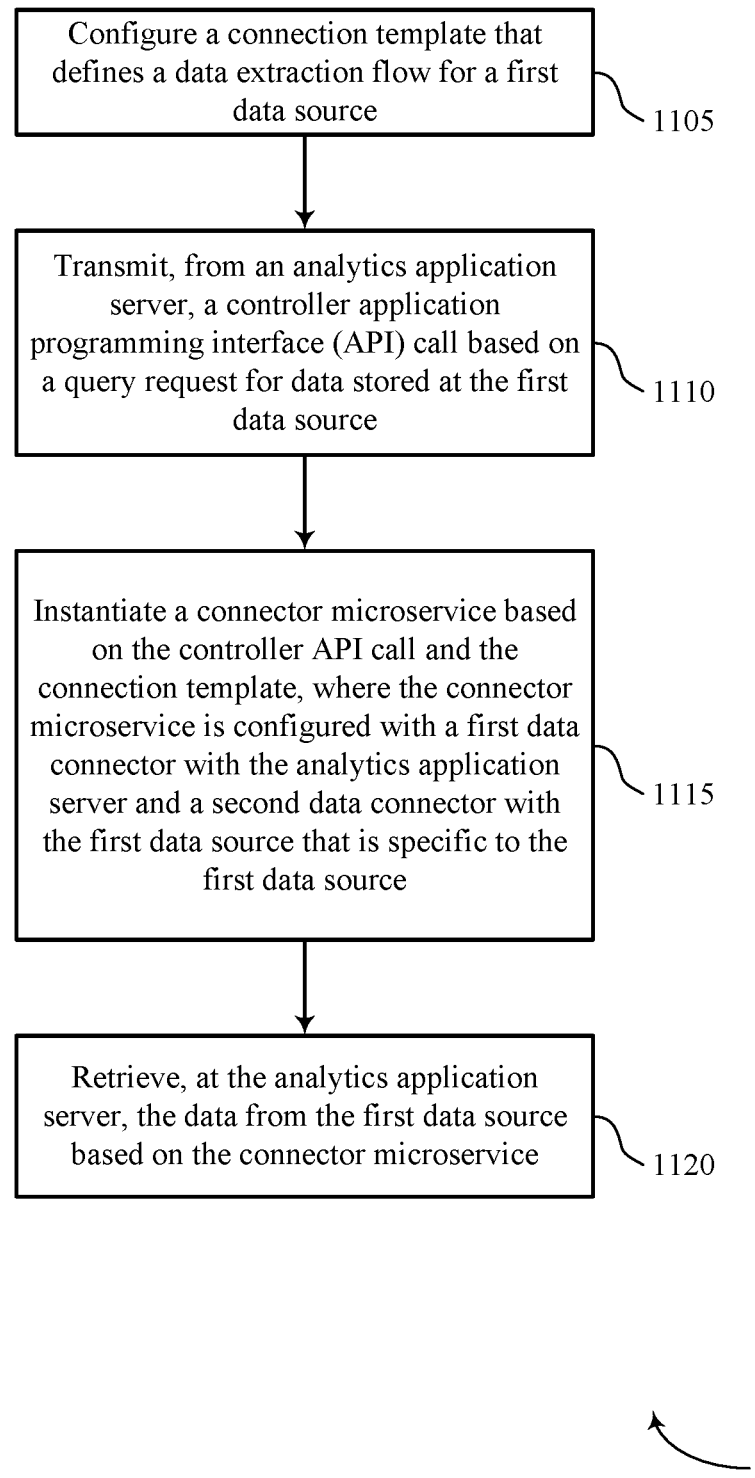
FIGS. 11 through 14 show flowcharts illustrating methods that support data interface for secure analytic data system integration in accordance with aspects of the present disclosure.

FIG. 11 shows a flowchart illustrating a method 1100 that supports data interface for secure analytic data system integration in accordance with aspects of the present disclosure. The operations of method 1100 may be implemented by a application server or its components as described herein. For example, the operations of method 1100 may be performed by a integration manager as described with reference to FIGS. 8 through 10. In some examples, a application server may execute a set of instructions to control the functional elements of the application server to perform the functions described below. Additionally or alternatively, a application server may perform aspects of the functions described below using special-purpose hardware.

At 1105, the application server may configure a connection template that defines a data extraction flow for a first data source. The operations of 1105 may be performed according to the methods described herein. In some examples, aspects of the operations of 1105 may be performed by a connection template component as described with reference to FIGS. 8 through 10.

At 1110, the application server may transmit, from an analytics application server, a controller application programming interface (API) call based on a query request for data stored at the first data source. The operations of 1110 may be performed according to the methods described herein. In some examples, aspects of the operations of 1110 may be performed by a controller API component as described with reference to FIGS. 8 through 10.

At 1115, the application server may instantiate a connector microservice based on the controller API call and the connection template, where the connector microservice is configured with a first data connector with the analytics application server and a second data connector with the first data source that is specific to the first data source. The operations of 1115 may be performed according to the methods described herein. In some examples, aspects of the operations of 1115 may be performed by a microservice component as described with reference to FIGS. 8 through 10.

At 1120, the application server may retrieve, at the analytics application server, the data from the first data source based on the connector microservice. The operations of 1120 may be performed according to the methods described herein. In some examples, aspects of the operations of 1120 may be performed by a data retrieval component as described with reference to FIGS. 8 through 10.

Figure 12:
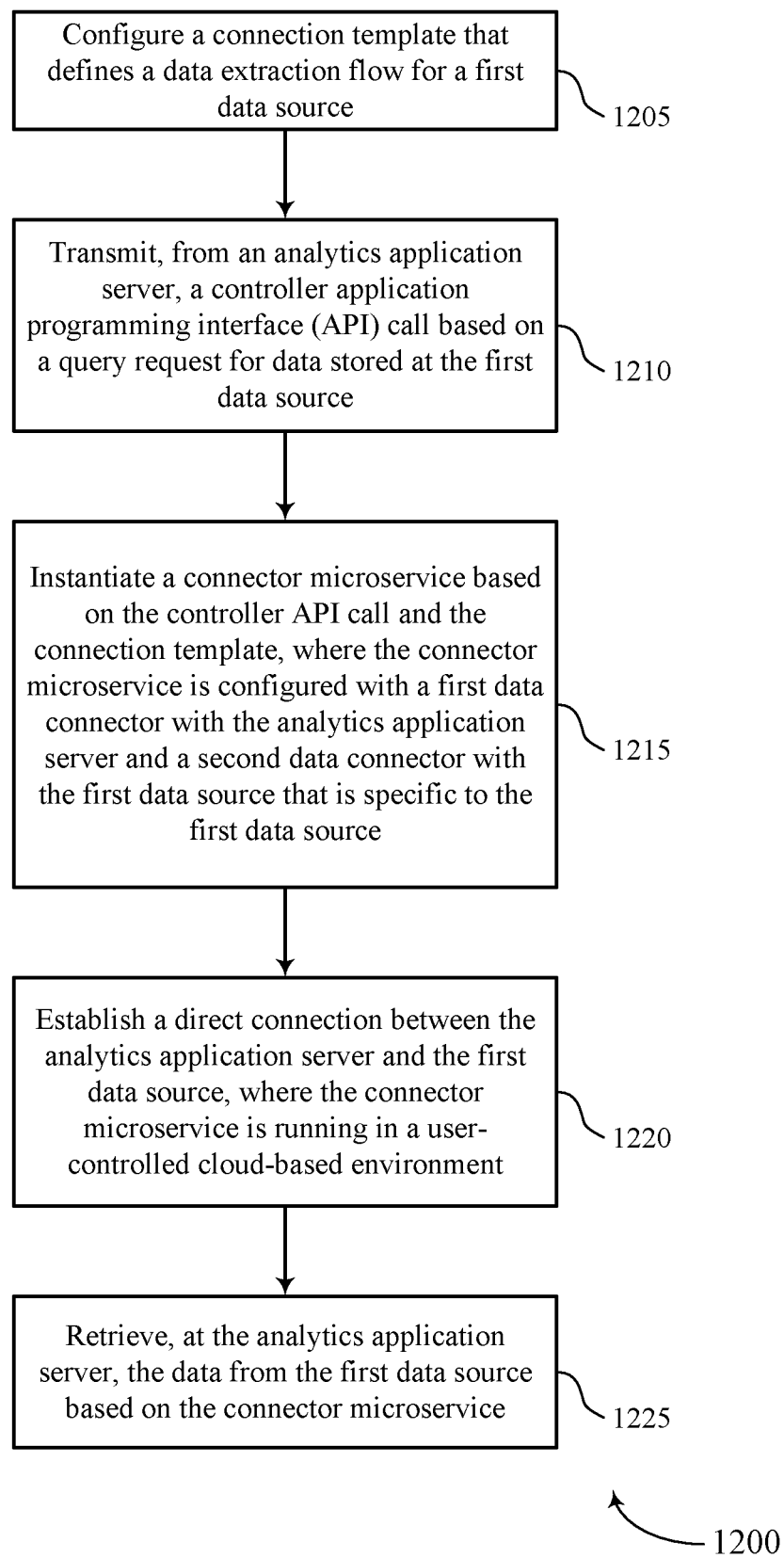

FIG. 12 shows a flowchart illustrating a method 1200 that supports data interface for secure analytic data system integration in accordance with aspects of the present disclosure. The operations of method 1200 may be implemented by a application server or its components as described herein. For example, the operations of method 1200 may be performed by a integration manager as described with reference to FIGS. 8 through 10. In some examples, a application server may execute a set of instructions to control the functional elements of the application server to perform the functions described below. Additionally or alternatively, a application server may perform aspects of the functions described below using special-purpose hardware.

At 1205, the application server may configure a connection template that defines a data extraction flow for a first data source. The operations of 1205 may be performed according to the methods described herein. In some examples, aspects of the operations of 1205 may be performed by a connection template component as described with reference to FIGS. 8 through 10.

At 1210, the application server may transmit, from an analytics application server, a controller application programming interface (API) call based on a query request for data stored at the first data source. The operations of 1210 may be performed according to the methods described herein. In some examples, aspects of the operations of 1210 may be performed by a controller API component as described with reference to FIGS. 8 through 10.

At 1215, the application server may instantiate a connector microservice based on the controller API call and the connection template, where the connector microservice is configured with a first data connector with the analytics application server and a second data connector with the first data source that is specific to the first data source. The operations of 1215 may be performed according to the methods described herein. In some examples, aspects of the operations of 1215 may be performed by a microservice component as described with reference to FIGS. 8 through 10.

At 1220, the application server may establish a direct connection between the analytics application server and the first data source, where the connector microservice is running in a user-controlled cloud-based environment. The operations of 1220 may be performed according to the methods described herein. In some examples, aspects of the operations of 1220 may be performed by a microservice component as described with reference to FIGS. 8 through 10.

At 1225, the application server may retrieve, at the analytics application server, the data from the first data source based on the connector microservice. The operations of 1225 may be performed according to the methods described herein. In some examples, aspects of the operations of 1225 may be performed by a data retrieval component as described with reference to FIGS. 8 through 10.

Figure 13:
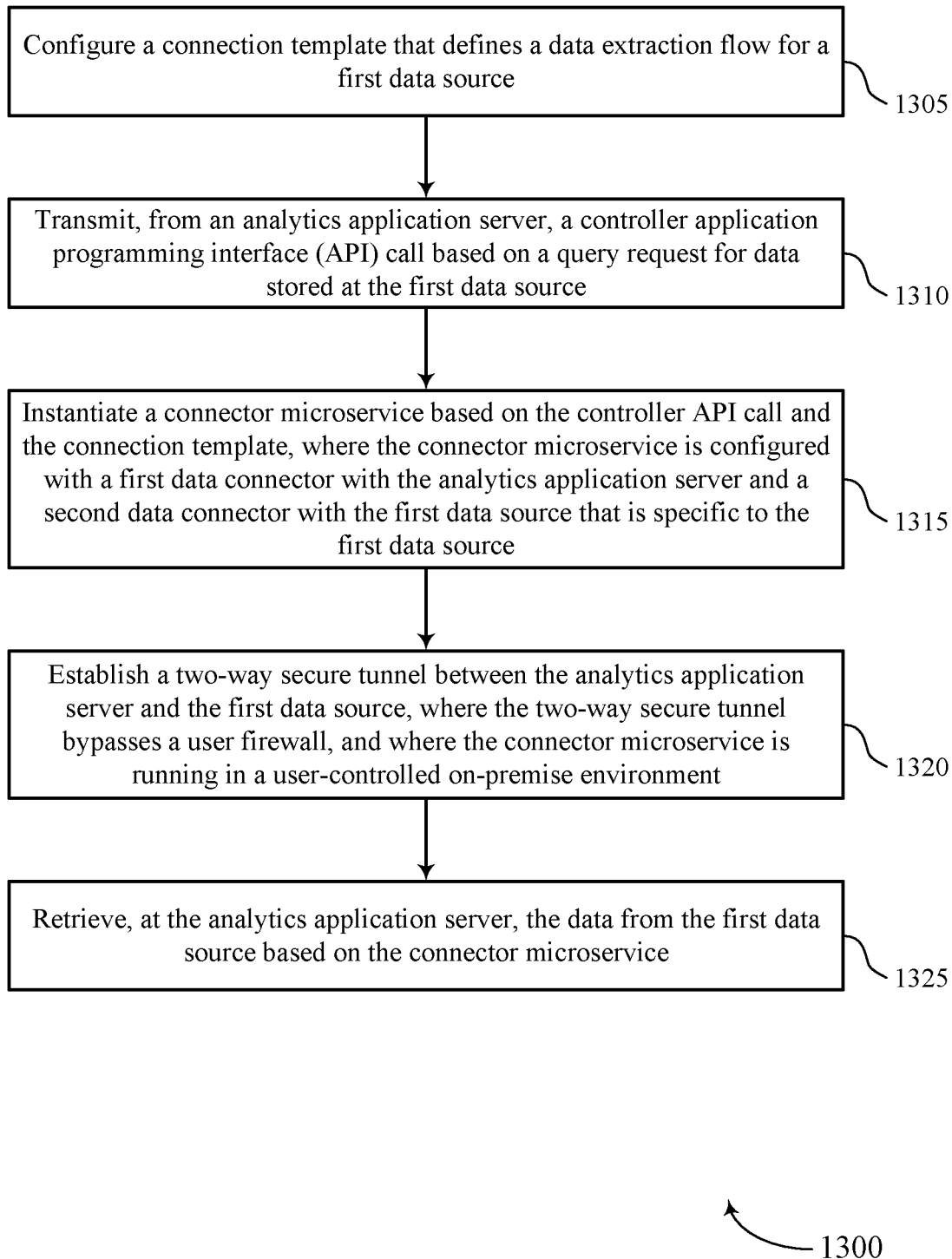

FIG. 13 shows a flowchart illustrating a method 1300 that supports data interface for secure analytic data system integration in accordance with aspects of the present disclosure. The operations of method 1300 may be implemented by a application server or its components as described herein. For example, the operations of method 1300 may be performed by a integration manager as described with reference to FIGS. 8 through 10. In some examples, a application server may execute a set of instructions to control the functional elements of the application server to perform the functions described below. Additionally or alternatively, a application server may perform aspects of the functions described below using special-purpose hardware.

At 1305, the application server may configure a connection template that defines a data extraction flow for a first data source. The operations of 1305 may be performed according to the methods described herein. In some examples, aspects of the operations of 1305 may be performed by a connection template component as described with reference to FIGS. 8 through 10.

At 1310, the application server may transmit, from an analytics application server, a controller application programming interface (API) call based on a query request for data stored at the first data source. The operations of 1310 may be performed according to the methods described herein. In some examples, aspects of the operations of 1310 may be performed by a controller API component as described with reference to FIGS. 8 through 10.

At 1315, the application server may instantiate a connector microservice based on the controller API call and the connection template, where the connector microservice is configured with a first data connector with the analytics application server and a second data connector with the first data source that is specific to the first data source. The operations of 1315 may be performed according to the methods described herein. In some examples, aspects of the operations of 1315 may be performed by a microservice component as described with reference to FIGS. 8 through 10.

At 1320, the application server may establish a two-way secure tunnel between the analytics application server and the first data source, where the two-way secure tunnel bypasses a user firewall, and where the connector microservice is running in a user-controlled on-premise environment. The operations of 1320 may be performed according to the methods described herein. In some examples, aspects of the operations of 1320 may be performed by a microservice component as described with reference to FIGS. 8 through 10.

At 1325, the application server may retrieve, at the analytics application server, the data from the first data source based on the connector microservice. The operations of 1325 may be performed according to the methods described herein. In some examples, aspects of the operations of 1325 may be performed by a data retrieval component as described with reference to FIGS. 8 through 10.

Figure 14:
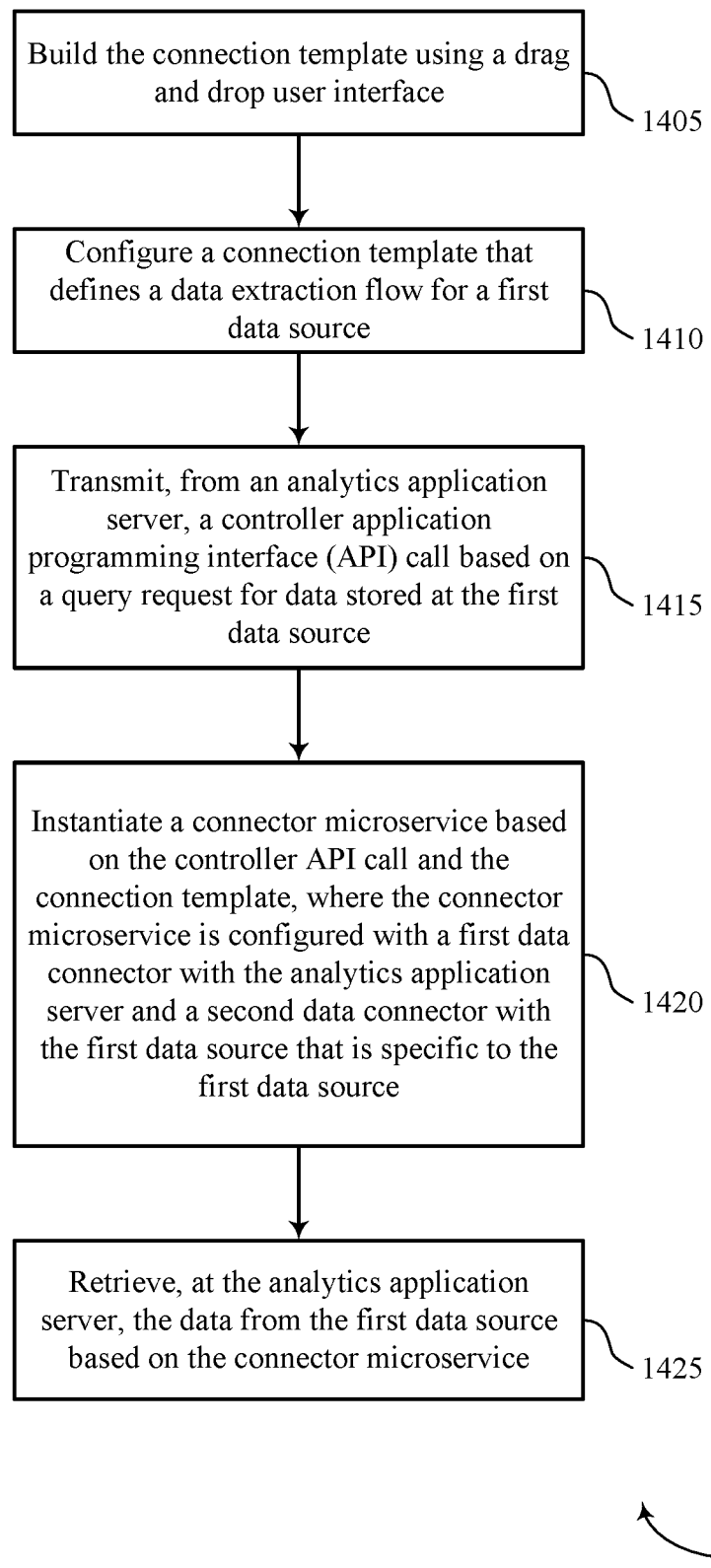

FIG. 14 shows a flowchart illustrating a method 1400 that supports data interface for secure analytic data system integration in accordance with aspects of the present disclosure. The operations of method 1400 may be implemented by a application server or its components as described herein. For example, the operations of method 1400 may be performed by a integration manager as described with reference to FIGS. 8 through 10. In some examples, a application server may execute a set of instructions to control the functional elements of the application server to perform the functions described below. Additionally or alternatively, a application server may perform aspects of the functions described below using special-purpose hardware.

At 1405, the application server may build the connection template using a drag and drop user interface. The operations of 1405 may be performed according to the methods described herein. In some examples, aspects of the operations of 1405 may be performed by a connection template component as described with reference to FIGS. 8 through 10.

At 1410, the application server may configure a connection template that defines a data extraction flow for a first data source. The operations of 1410 may be performed according to the methods described herein. In some examples, aspects of the operations of 1410 may be performed by a connection template component as described with reference to FIGS. 8 through 10.

At 1415, the application server may transmit, from an analytics application server, a controller application programming interface (API) call based on a query request for data stored at the first data source. The operations of 1415 may be performed according to the methods described herein. In some examples, aspects of the operations of 1415 may be performed by a controller API component as described with reference to FIGS. 8 through 10.

At 1420, the application server may instantiate a connector microservice based on the controller API call and the connection template, where the connector microservice is configured with a first data connector with the analytics application server and a second data connector with the first data source that is specific to the first data source. The operations of 1420 may be performed according to the methods described herein. In some examples, aspects of the operations of 1420 may be performed by a microservice component as described with reference to FIGS. 8 through 10.

At 1425, the application server may retrieve, at the analytics application server, the data from the first data source based on the connector microservice. The operations of 1425 may be performed according to the methods described herein. In some examples, aspects of the operations of 1425 may be performed by a data retrieval component as described with reference to FIGS. 8 through 10.

A method of data processing is described. The method may include configuring a connection template that defines a data extraction flow for a first data source, transmitting, from an analytics application server, a controller application programming interface (API) call based on a query request for data stored at the first data source, instantiating a connector microservice based on the controller API call and the connection template, where the connector microservice is configured with a first data connector with the analytics application server and a second data connector with the first data source that is specific to the first data source, and retrieving, at the analytics application server, the data from the first data source based on the connector microservice.

An apparatus for data processing is described. The apparatus may include a processor, memory coupled with the processor, and instructions stored in the memory. The instructions may be executable by the processor to cause the apparatus to configure a connection template that defines a data extraction flow for a first data source, transmit, from an analytics application server, a controller application programming interface (API) call based on a query request for data stored at the first data source, instantiate a connector microservice based on the controller API call and the connection template, where the connector microservice is configured with a first data connector with the analytics application server and a second data connector with the first data source that is specific to the first data source, and retrieve, at the analytics application server, the data from the first data source based on the connector microservice.

Another apparatus for data processing is described. The apparatus may include means for configuring a connection template that defines a data extraction flow for a first data source, transmitting, from an analytics application server, a controller application programming interface (API) call based on a query request for data stored at the first data source, instantiating a connector microservice based on the controller API call and the connection template, where the connector microservice is configured with a first data connector with the analytics application server and a second data connector with the first data source that is specific to the first data source, and retrieving, at the analytics application server, the data from the first data source based on the connector microservice.

A non-transitory computer-readable medium storing code for data processing is described. The code may include instructions executable by a processor to configure a connection template that defines a data extraction flow for a first data source, transmit, from an analytics application server, a controller application programming interface (API) call based on a query request for data stored at the first data source, instantiate a connector microservice based on the controller API call and the connection template, where the connector microservice is configured with a first data connector with the analytics application server and a second data connector with the first data source that is specific to the first data source, and retrieve, at the analytics application server, the data from the first data source based on the connector microservice.

Some examples of the method, apparatuses, and non-transitory computer-readable medium described herein may further include operations, features, means, or instructions for establishing a direct connection between the analytics application server and the first data source, where the connector microservice may be running in a user-controlled cloud-based environment.

Some examples of the method, apparatuses, and non-transitory computer-readable medium described herein may further include operations, features, means, or instructions for establishing a two-way secure tunnel between the analytics application server and the first data source, where the two-way secure tunnel bypasses a user firewall, and where the connector microservice may be running in a user-controlled on-premise environment.

Some examples of the method, apparatuses, and non-transitory computer-readable medium described herein may further include operations, features, means, or instructions for building the connection template using a drag and drop user interface.

In some examples of the method, apparatuses, and non-transitory computer-readable medium described herein, the controller API call includes configuration parameters that specify an access configuration for the first data source.

In some examples of the method, apparatuses, and non-transitory computer-readable medium described herein, the connector microservice includes one or more virtual machines.

In some examples of the method, apparatuses, and non-transitory computer-readable medium described herein, the data may be retrieved from the first data source via a pull-based technique.

It should be noted that the methods described above describe possible implementations, and that the operations and the steps may be rearranged or otherwise modified and that other implementations are possible. Furthermore, aspects from two or more of the methods may be combined.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for data processing, comprising:
configuring a connection template that defines a data extraction flow for a first data source;
transmitting, from an analytics application server, a controller application programming interface (API) call based at least in part on a query request for data stored at the first data source;
instantiating a connector microservice based at least in part on the controller API call and the connection template, wherein the connector microservice is configured with a first data connector with the analytics application server and a second data connector with the first data source that is specific to the first data source; and
retrieving, at the analytics application server, the data from the first data source based at least in part on the connector microservice.

2. The method of claim 1, further comprising:
establishing a direct connection between the analytics application server and the first data source, wherein the connector microservice is running in a user-controlled cloud-based environment.

3. The method of claim 1, further comprising:
establishing a two-way secure tunnel between the analytics application server and the first data source, wherein the two-way secure tunnel bypasses a user firewall, and wherein the connector microservice is running in a user-controlled on-premise environment.

4. The method of claim 1, further comprising:
building the connection template using a drag and drop user interface.

5. The method of claim 1, wherein the controller API call comprises configuration parameters that specify an access configuration for the first data source.

6. The method of claim 1, wherein the connector microservice comprises one or more virtual machines.

7. The method of claim 1, wherein the data is retrieved from the first data source via a pull-based technique.

8. An apparatus for data processing, comprising:
a processor,
memory coupled with the processor; and
instructions stored in the memory and executable by the processor to cause the apparatus to:
configure a connection template that defines a data extraction flow for a first data source;
transmit, from an analytics application server, a controller application programming interface (API) call based at least in part on a query request for data stored at the first data source;
instantiate a connector microservice based at least in part on the controller API call and the connection template, wherein the connector microservice is configured with a first data connector with the analytics application server and a second data connector with the first data source that is specific to the first data source; and
retrieve, at the analytics application server, the data from the first data source based at least in part on the connector microservice.

9. The apparatus of claim 8, wherein the instructions are further executable by the processor to cause the apparatus to:
establish a direct connection between the analytics application server and the first data source, wherein the connector microservice is running in a user-controlled cloud-based environment.

10. The apparatus of claim 8, wherein the instructions are further executable by the processor to cause the apparatus to:
establish a two-way secure tunnel between the analytics application server and the first data source, wherein the two-way secure tunnel bypasses a user firewall, and wherein the connector microservice is running in a user-controlled on-premise environment.

11. The apparatus of claim 8, wherein the instructions are further executable by the processor to cause the apparatus to:
build the connection template using a drag and drop user interface.

12. The apparatus of claim 8, wherein the controller API call comprises configuration parameters that specify an access configuration for the first data source.

13. The apparatus of claim 8, wherein the connector microservice comprises one or more virtual machines.

14. The apparatus of claim 8, wherein: the data is retrieved from the first data source via a pull-based technique.

15. A non-transitory computer-readable medium storing code for data processing, the code comprising instructions executable by a processor to:
configure a connection template that defines a data extraction flow for a first data source;
transmit, from an analytics application server, a controller application programming interface (API) call based at least in part on a query request for data stored at the first data source;
instantiate a connector microservice based at least in part on the controller API call and the connection template, wherein the connector microservice is configured with a first data connector with the analytics application server and a second data connector with the first data source that is specific to the first data source; and
retrieve, at the analytics application server, the data from the first data source based at least in part on the connector microservice.

16. The non-transitory computer-readable medium of claim 15, wherein the instructions are further executable to:
   establish a direct connection between the analytics application server and the first data source, wherein the connector microservice is running in a user-controlled cloud-based environment.

17. The non-transitory computer-readable medium of claim 15, wherein the instructions are further executable to:
   establish a two-way secure tunnel between the analytics application server and the first data source, wherein the two-way secure tunnel bypasses a user firewall, and wherein the connector microservice is running in a user-controlled on-premise environment.

18. The non-transitory computer-readable medium of claim 15, wherein the instructions are further executable to:
   build the connection template using a drag and drop user interface.

19. The non-transitory computer-readable medium of claim 15, wherein the controller API call comprises configuration parameters that specify an access configuration for the first data source.

20. The non-transitory computer-readable medium of claim 15, wherein the connector microservice comprises one or more virtual machines.

* * * * *